United States Patent
Zhang (10) Patent No.: US 9,786,571 B1
(45) Date of Patent: Oct. 10, 2017

(54) TEST KEY

(71) Applicant: United Microelectronics Corp., Hsinchu (TW)

(72) Inventor: Fei Zhang, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/436,466

(22) Filed: Feb. 17, 2017

(51) Int. Cl.
*H01L 21/66* (2006.01)
*H01L 23/522* (2006.01)
*H01L 23/528* (2006.01)
*H01L 23/482* (2006.01)
*H01L 29/06* (2006.01)

(52) U.S. Cl.
CPC .......... *H01L 22/32* (2013.01); *H01L 23/4824* (2013.01); *H01L 23/528* (2013.01); *H01L 23/5226* (2013.01); *H01L 29/0692* (2013.01)

(58) Field of Classification Search
None
See application file for complete search history.

(56) References Cited

U.S. PATENT DOCUMENTS

| | | | | |
|---|---|---|---|---|
| 5,889,410 A * | 3/1999 | El-Kareh | ............... | H01L 22/34 257/48 |
| 5,952,674 A * | 9/1999 | Edelstein | ............... | H01L 22/34 257/48 |
| 6,521,910 B1 * | 2/2003 | Lin | ......... | H01L 22/34 257/48 |
| 7,098,049 B2 * | 8/2006 | Hsu | ......... | H01L 22/34 257/E21.546 |
| 8,138,497 B2 * | 3/2012 | Zhu | .................. | H01L 21/76227 257/48 |
| 8,598,579 B2 | 12/2013 | Chumakov et al. | | |
| 2001/0050857 A1 * | 12/2001 | Keeth | ................... | G11C 5/025 365/51 |
| 2006/0138411 A1 * | 6/2006 | Lachenmann | ......... | H01L 22/34 257/48 |
| 2012/0293196 A1 * | 11/2012 | Hsu | .................... | G01R 31/2644 324/762.01 |

* cited by examiner

*Primary Examiner* — Bilkis Jahan
(74) *Attorney, Agent, or Firm* — J.C. Patents (57) ABSTRACT

Provided is a test key including a plurality of diffusion regions, a plurality of gate lines, a dielectric layer, a first comb structure and a second comb structure. The diffusion regions are disposed in a substrate and parallel to each other. The gate lines are disposed on the substrate and across the diffusion regions. The dielectric layer covers the gate lines and the diffusion regions. The first comb structure includes a plurality of first metal teeth disposed on the dielectric layer and overlapping with the diffusion regions. The second comb structure includes a plurality of second metal teeth disposed on the dielectric layer and not overlapping with the diffusion regions.

17 Claims, 8 Drawing Sheets

TEST KEY

BACKGROUND OF THE INVENTION

Field of Invention

The present invention is related to an integrated circuit element, and more generally to a test key.

Description of Related Art

In a semiconductor fabrication, a semiconductor device or an integrated circuit is continuously tested in every step so as to maintain the device or circuit quality. Normally, a testing circuit is simultaneously fabricated with an actual device so that the quality of the actual device is judged by the performance of the testing circuit. The quality of the actual device is therefore well controlled. A wafer acceptance test (WAT) is frequently employed to detect defects on a wafer. The WAT method includes testing several test keys distributed on scribe lines between dies. Various test keys for detecting different defects are developed.

SUMMARY OF THE INVENTION

The present invention provides a test key for detecting a void in an interlayer dielectric (ILD) layer between gate lines, so as to sensitively monitor the leakage current induced by the ILD void.

The present invention provides a test key including a plurality of diffusion regions, a plurality of gate lines, a dielectric layer, a first comb structure and a second comb structure. The diffusion regions are disposed in a substrate and parallel to each other. The gate lines are disposed on the substrate and across the diffusion regions. The dielectric layer covers the gate lines and the diffusion regions. The first comb structure includes a plurality of first metal teeth disposed on the dielectric layer and overlapping with the diffusion regions. The second comb structure includes a plurality of second metal teeth disposed on the dielectric layer and not overlapping with the diffusion regions.

According to an embodiment of the present invention, a distance between two adjacent gate lines is constant.

According to an embodiment of the present invention, a distance between two adjacent gate lines is not constant.

According to an embodiment of the present invention, a distance between two adjacent first and second metal teeth is constant.

According to an embodiment of the present invention, a distance between two adjacent first and second metal teeth is not constant.

According to an embodiment of the present invention, one of the second metal teeth is between two adjacent first metal teeth.

According to an embodiment of the present invention, two adjacent second metal teeth are between two adjacent first metal teeth.

According to an embodiment of the present invention, the first metal teeth are electrically connected to the diffusion regions through a plurality of conductive plugs.

According to an embodiment of the present invention, one of the conductive plugs is between two adjacent gate lines.

According to an embodiment of the present invention, first ends of the gate lines are connected to each other, and second ends of the gate lines are connected to each other.

According to an embodiment of the present invention, first ends of the gate lines are separated from each other, and second ends of the gate lines are separated from each other.

According to an embodiment of the present invention, at least one of the second metal teeth is electrically connected to an adjacent diffusion region when a void is generated in the dielectric layer.

According to an embodiment of the present invention, the second metal teeth are electrically insulated from the diffusion regions when no void is generated in the dielectric layer.

According to an embodiment of the present invention, the first comb structure and the second comb structure are electrically connected to a test circuit that is used to measure a leakage current created by voids in the dielectric layer.

According to an embodiment of the present invention, the gate lines include polysilicon, silicide, metal or a combination thereof.

According to an embodiment of the present invention, the diffusion regions are isolated by isolation regions.

According to an embodiment of the present invention, a first surface of one isolation region between two adjacent gate lines is lower than a second surface of the isolation region below the gate lines.

In view of the above, the test key of the invention is a four-layer structure including diffusion regions, gate lines across the diffusion regions, an interlayer dielectric (ILD) over the gate lines, and first and second comb structures having first and second metal teeth interlaced with each other. Besides, the first metal teeth of the first comb structure are configured to overlap with the diffusion regions while the second metal teeth of the second comb structure are configured not to overlap with the diffusion regions. By such configuration, the test key of the invention can be used to sensitively detect the leakage current induced by the ILD void.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1:
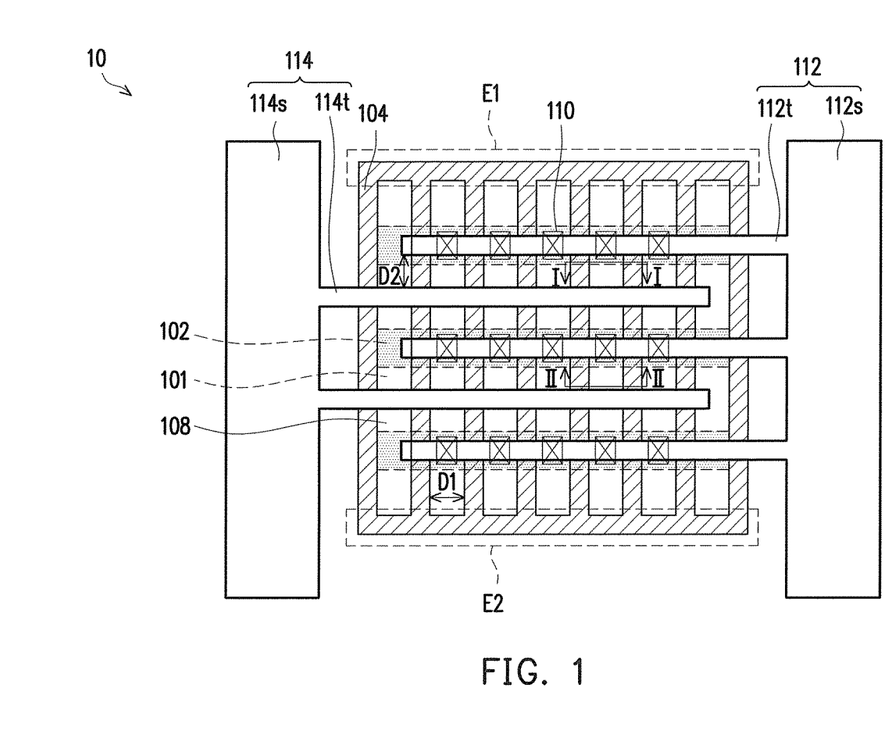
FIG. 1 illustrates a schematic top view of a test key according to an embodiment of the present invention, in which no void is generated in a dielectric layer between gate lines.
Figure 2A:
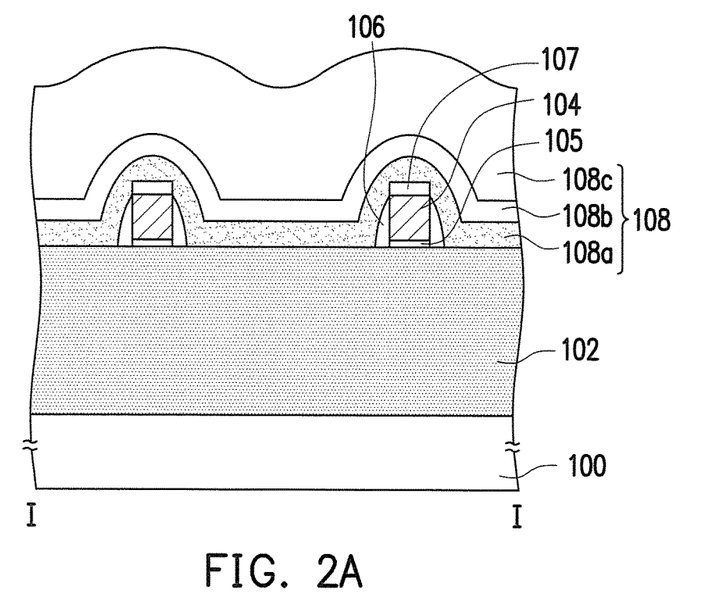
FIG. 2A illustrates a schematic cross-sectional view taken along the line I-I of FIG. 1.
Figure 2B:
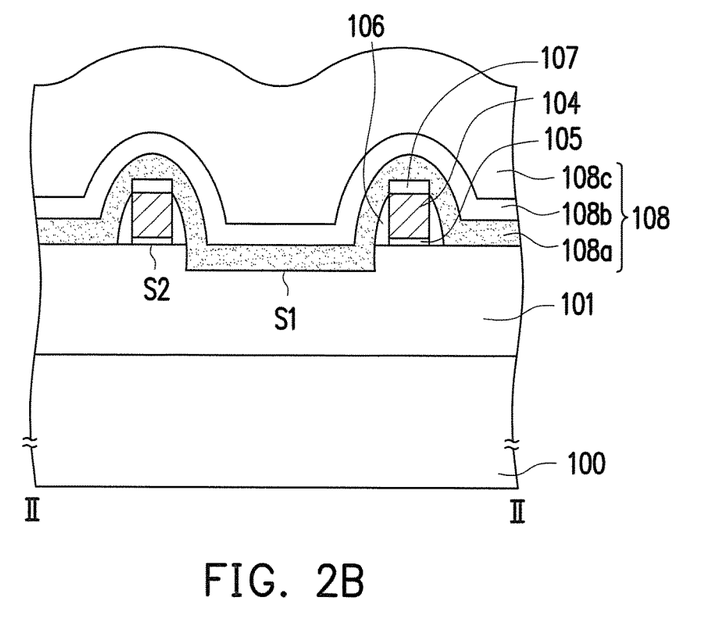
FIG. 2B illustrates a schematic cross-sectional view taken along the line II-II of FIG. 1.

FIG. 1 illustrates a schematic top view of a test key according to an embodiment of the present invention, in which no void is generated in a dielectric layer between gate lines. FIG. 2A and FIG. 2B illustrate schematic cross-sectional views respectively taken along the line I-I and the line II-II of FIG. 1. FIGS. 3-6 illustrate schematic top views of test keys according to some embodiments of the present invention. The test keys of FIGS. 3-6 are similar to the test key of FIG. 1, so the difference is illustrated below and the similarity is not iterated herein.

Referring to FIG. 1, FIG. 2A and FIG. 2B, a test key 10 includes a substrate 100 having a plurality of diffusion regions 102 formed therein. The substrate 100 includes a semiconductor material, such as silicon. In an embodiment, the diffusion regions 102 are parallel to each other and extend along a first direction. Buried regions (not shown) are optionally disposed between the diffusion regions 102 and the substrate 100. In an embodiment, the buried regions have a conductivity type different from that of the diffusion regions 102, so PN junctions formed between them help to reduce the substrate leakage current. Besides, two adjacent diffusion regions 102 are isolated by an isolation region 101, such as a shallow trench isolation (STI) structure. In an embodiment, the isolation regions 101 include silicon oxide.

The test key 10 further includes a plurality of gate lines 104 formed across the diffusion regions 102 and isolation regions 101. In an embodiment, the gate lines 104 extend along a second direction different from (e.g., perpendicular to) the first direction. For example, the first direction is X-direction, and the second direction is Y-direction. In an embodiment, the gate lines 104 include polysilicon, silicide, metal or a combination thereof. A gate dielectric layer 105 is disposed between each of the gate lines 104 and the substrate 100. In an embodiment, the gate dielectric layers 105 include a silicon oxide, silicon oxynitride, a high dielectric constant (high-k) material such as metal oxide, or a combination thereof. An optional cap layer 107 is disposed over each of the gate lines 104. In an embodiment, the cap layers 107 include silicon nitride.

Figure 3:
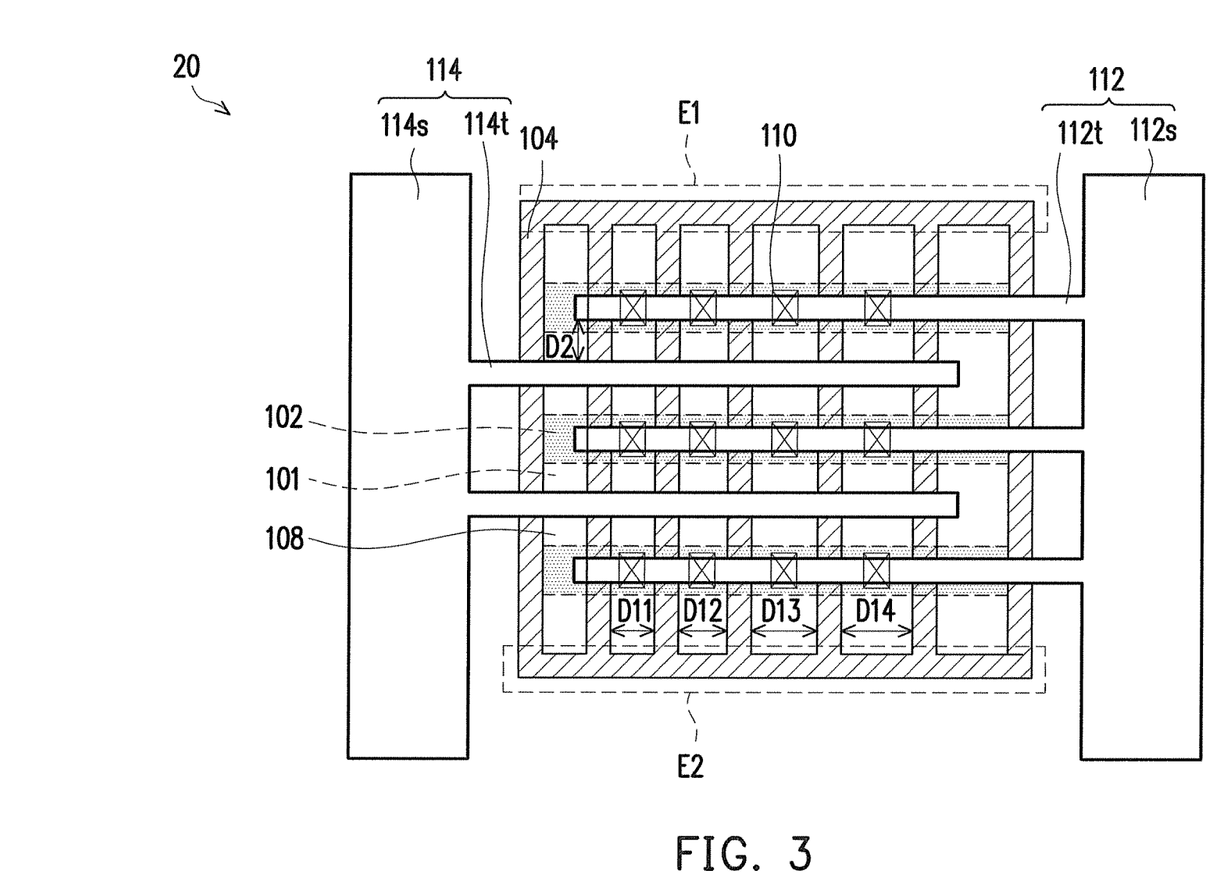
FIGS. 3-6 illustrate schematic top views of test keys according to some embodiments of the present invention.
Figure 4:
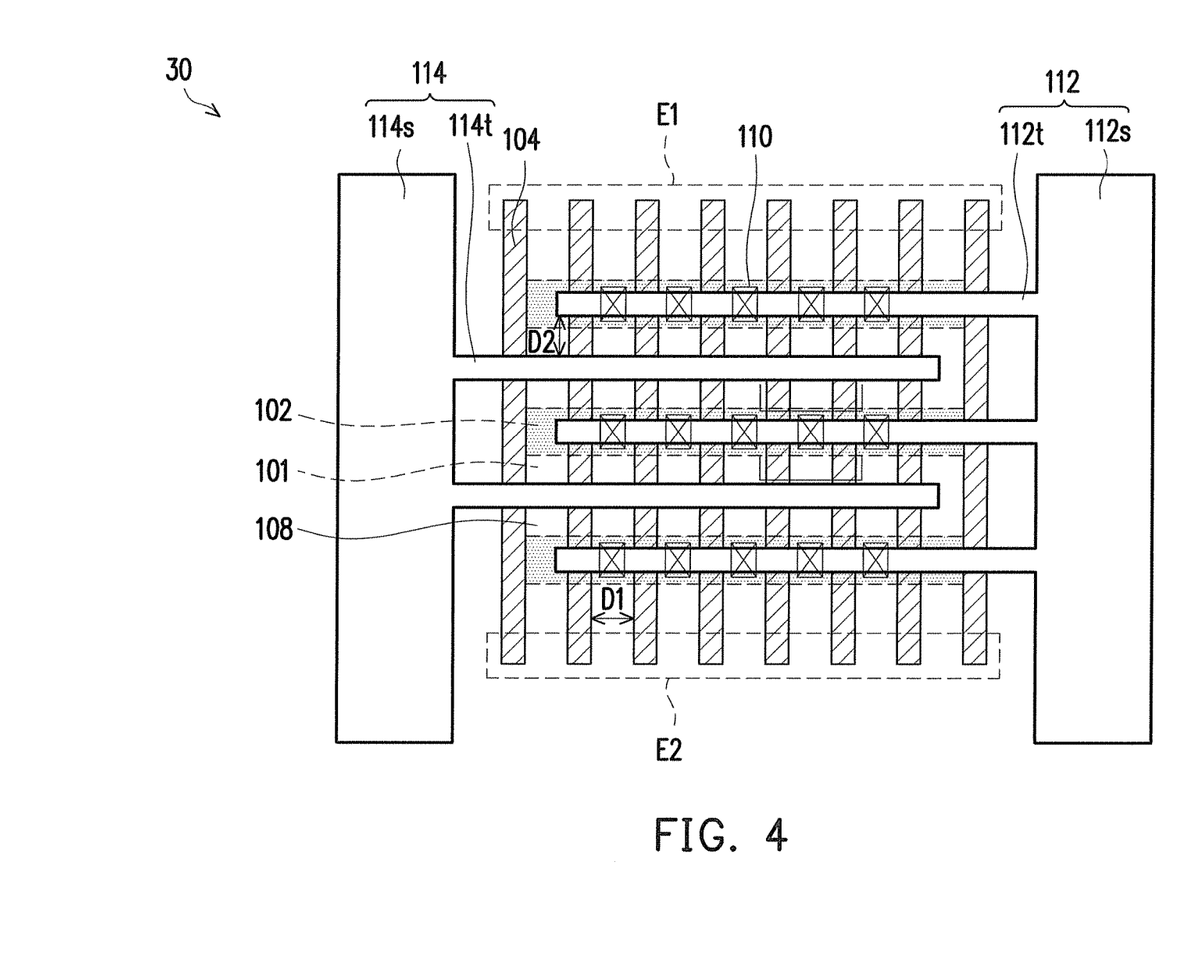

In an embodiment, a distance D1 between two adjacent gate lines 104 is constant, as shown in FIG. 1. In another embodiment, a distance D1 between two adjacent gate lines 104 is not constant, as shown in the test key 20 of FIG. 3. For example, the distance between two adjacent gate lines 104 is gradually reduced or increased from one side to the opposite side. Specifically, the distances D11-D14 between successive adjacent gate lines 104 are gradually increased from the left side to the right side, as shown in FIG. 3.

In an embodiment, first ends E1 of the gate lines 104 are connected to each other, and second ends E2 of the gate lines 104 are connected to each other, as shown in FIG. 1. In another embodiment, the first ends E1 of the gate lines 104 are separated from each other, and second ends E2 of the gate lines 104 are separated from each other, as shown in the test key 30 of FIG. 4.

In an embodiment, each of the gate lines 104 has two substantially vertical sidewalls, and a spacer 106 is formed on each of the two sidewalls, as shown in FIG. 2A and FIG. 2B. In an embodiment, the spacers 106 include a material the same as that of isolation regions 101, such as silicon oxide. The method of forming the spacers 106 includes forming a silicon oxide layer that covers the gate lines 104, the diffusion regions 102 and isolation regions 101. An anisotropic etching process is then performed to removing a portion of the silicon oxide layer. In an embodiment, the isolation regions 101 are partially removed during the anisotropic etching process of forming the spacers 106, so a first surface S1 of one isolation region 101 between two adjacent gate lines 104 is lower than a second surface S2 of the isolation region 101 below the gate lines 104, as shown in FIG. 2B.

The test key 10 further includes an interlayer dielectric (ILD) layer or a dielectric layer 108 over the substrate 100. Specifically, the dielectric layer 108 covers the isolation regions 101, the diffusion regions 102 and the gate lines 104. In an embodiment, the dielectric layer 108 includes silicon oxide, silicon nitride, undoped silicon oxide glass (USG), phosphosilicate glass (PSG), borophosphosilicate glass (BPSG), fluorinated silicate glass (FSG) or a combination thereof, and is formed by a suitable deposition process, such as a chemical vapour deposition (CVD) process. In an embodiment, the dielectric layer 108 is a tri-layer structure including, from bottom to top, a contact etching stop layer (CESL) 108a, a USG layer 108b and a PSG layer 108c, as shown in FIG. 2A and FIG. 2B. However, the present invention is not limited thereto. In other words, the number of the dielectric layers is not limited by the embodiment herein.

The test key 10 further includes a first comb structure 112 and a second comb structure 114 disposed on the dielectric layer 108. In an embodiment, the first comb structure 112 includes a first metal shaft 112s extending along the second direction, and a plurality of first metal teeth 112t protruding from the first metal shaft 112s and extending along the first direction. Besides, the first metal teeth 112t of the first comb structure 112 are disposed right above and overlapping with the diffusion regions 102, and are electrically connected to the diffusion regions 102 through a plurality of conductive plugs 110. In an embodiment, one of the conductive plugs 110 is between two adjacent gate lines 104, and the distance from the conductive plug 110 to the adjacent gate lines 104 keeps constant. The conductive plugs 110 include metal, such as tungsten. In an embodiment, the conductive plugs 110 has a dimension greater than that of the first metal teeth 112t, as shown in FIG. 1. In another embodiment, the dimension of the conductive plugs 110 can be the same as or smaller than the dimension of the first metal teeth 112t.

In an embodiment, the second comb structure 114 includes a second metal shaft 114s extending along the second direction, and a plurality of second metal teeth 114t protruding from the second metal shaft 114s and extending along the first direction. Besides, the second metal teeth 114t of the second comb structure 114 are disposed between and not overlapping with the diffusion regions 102.

Figure 5:
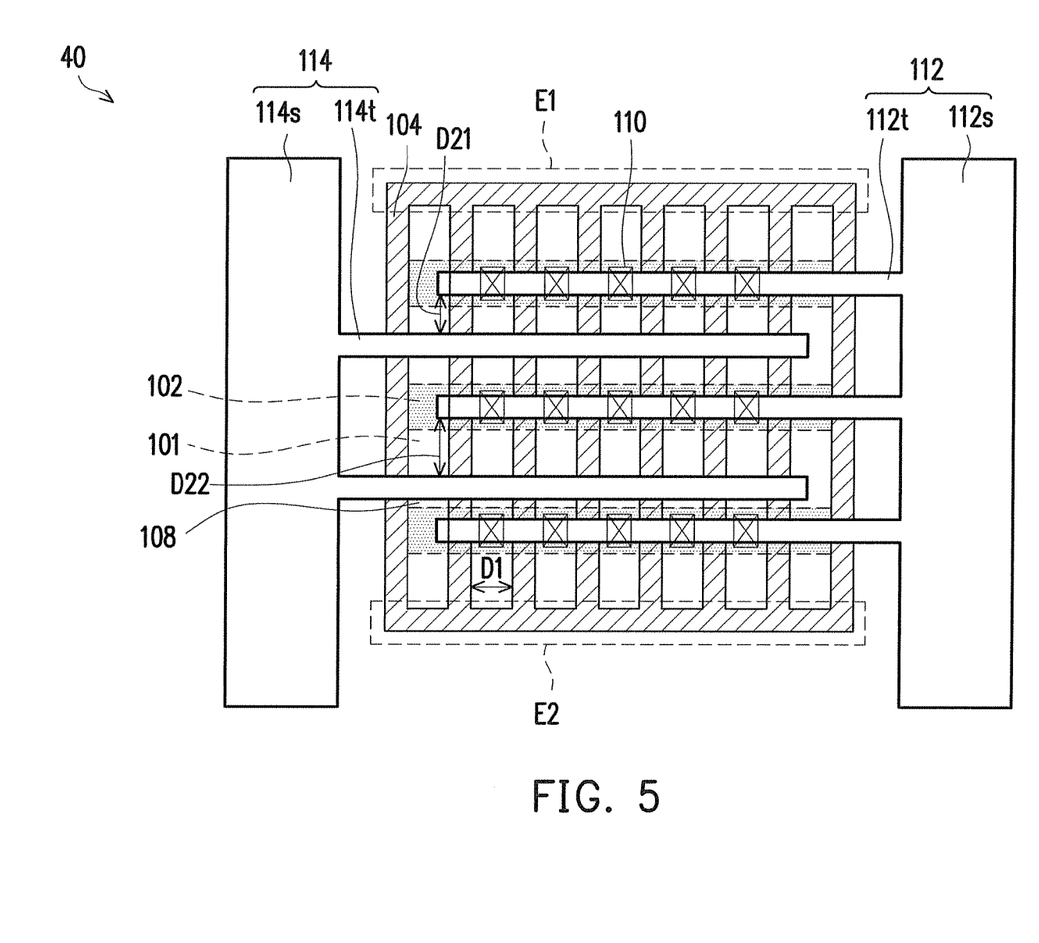
Figure 6:
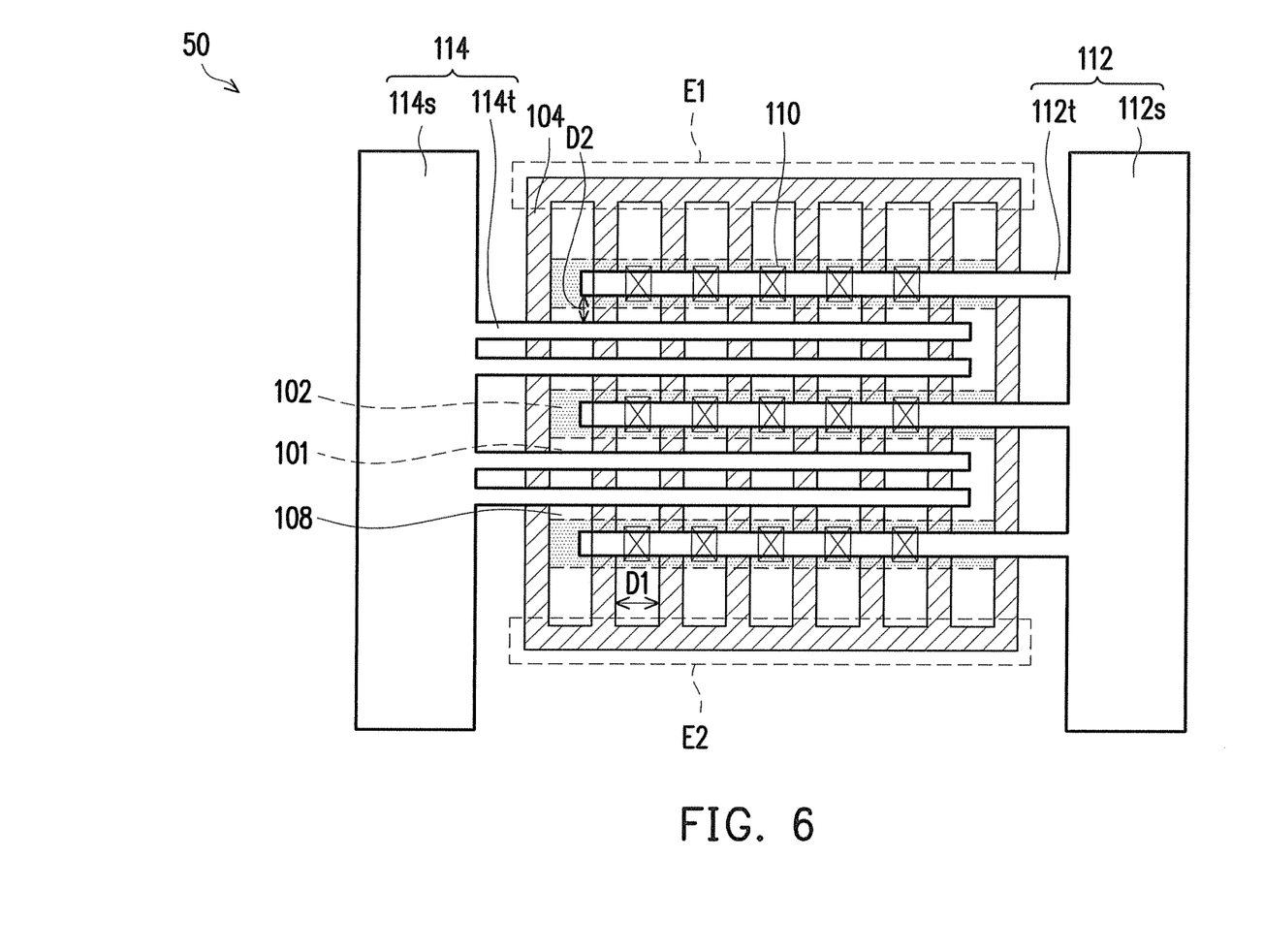

In an embodiment, the second metal teeth 114t of the second comb structure 114 are interlaced with the first metal teeth 112t of the first comb structure 112. In an embodiment, a distance D2 between two adjacent first and second metal teeth 112t and 114t is constant, as shown in FIG. 1. In another embodiment, a distance between two adjacent first and second metal teeth 112t and 114t is not constant, as shown in the test key 40 of FIG. 5. Specifically, at least two different distances D21 and D22 are provided between adjacent first and second metal teeth 112t and 114t, as shown in FIG. 5.

In an embodiment, one of the second metal teeth 114t is between two adjacent first metal teeth 112t, as shown in FIG. 1. In another embodiment, two adjacent second metal teeth 114t are between two adjacent first metal teeth 112t, as shown in the test key 50 of FIG. 6.

The method of forming the first and second comb structures 112 and 114 includes forming a metal layer over the dielectric layer 108 and patterning the metal layer.

It is noted that, one or more voids may be generated in the dielectric layer 108 between the gate lines 104 if the process/design parameters such as the distance between two adjacent gate lines 104, the thickness and filling capability of the dielectric layer 108 and/or the topography of the substrate 100 or STI structures are not controlled appropriately. The test key of the invention is therefore designed to sensitively detect if a void is generated in the dielectric layer 108. In an embodiment, the first and second comb structures 112 and 114 of each of the test keys of the invention are electrically connected to a test circuit that is used to measure a leakage current created by voids in the dielectric layer 108.

In an embodiment, as shown in FIG. 1, FIGS. 2A-2B and FIGS. 3-6, the second metal teeth 114t of the second comb structure 114 are electrically insulate from the diffusion regions 102 when no void is generated in the dielectric layer 108, and thus, no leakage current is detected by the test circuit.

Figure 7:
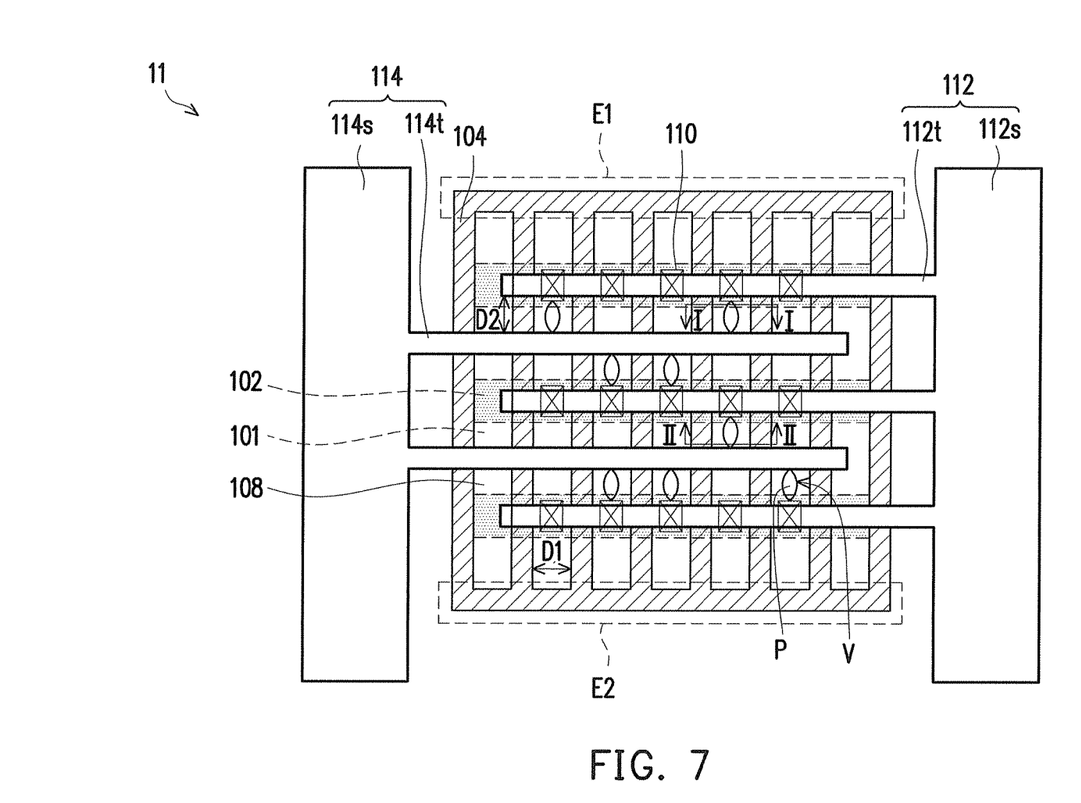
FIG. 7 illustrates a schematic top view of a test key according to another embodiment of the present invention, in which voids are generated in a dielectric layer between gate lines.
Figure 8A:
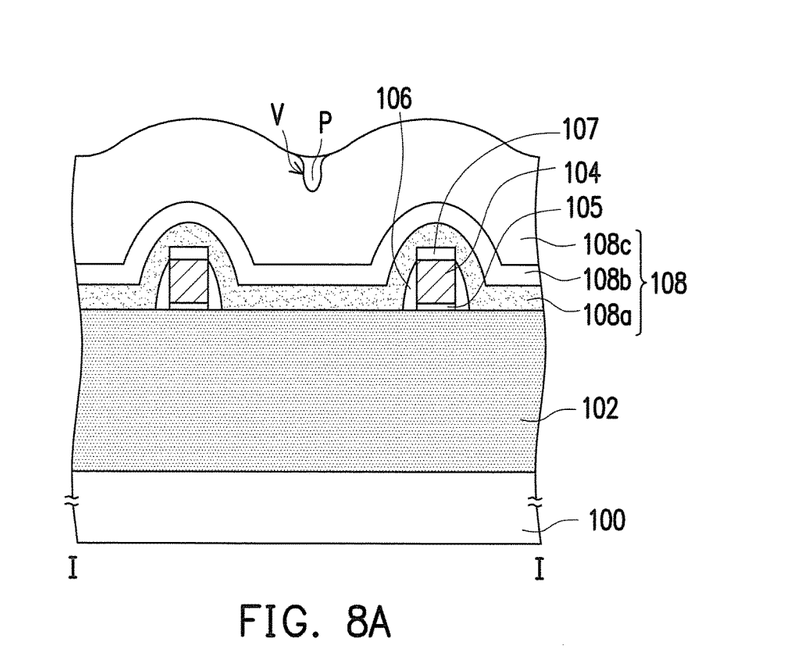
FIG. 8A illustrates a schematic cross-sectional view taken along the line I-I of FIG. 7.
Figure 8B:
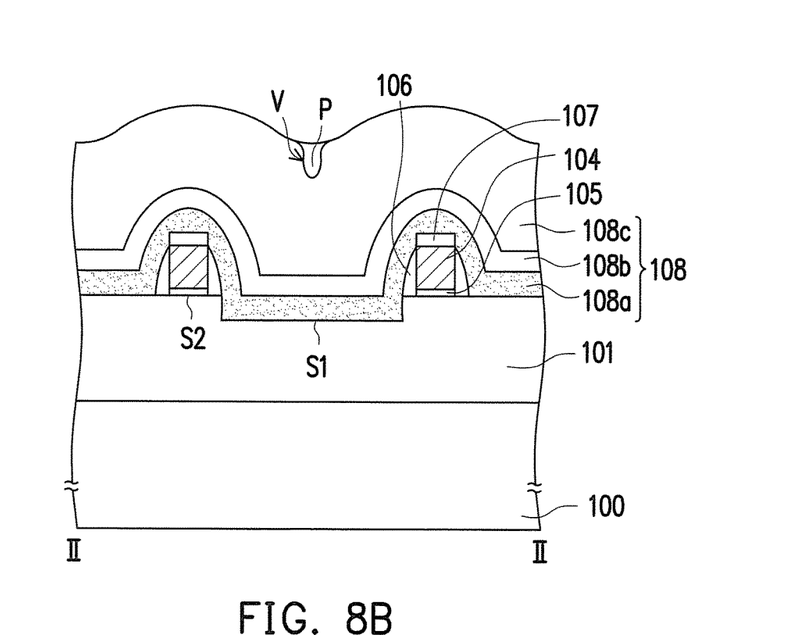
FIG. 8B illustrates a schematic cross-sectional view taken along the line II-II of FIG. 7.

However, when one or more voids V are generated in the dielectric layer 108, a leakage current is detected by the test circuit. Specifically, the metal layer for defining the first and second comb structures fills in the voids V in the dielectric layer 108 and therefore foul's leakage paths P between the adjacent first and second metal teeth 112t and 114t, as shown in FIG. 7 and FIGS. 8A-8B. Therefore, one or more of the second metal teeth 114t of the second comb structure 114 are electrically connected to the adjacent diffusion regions 104 through the leakage paths P and the adjacent first metal teeth 112t of the first comb structure 112.

In view of the above, the test key of the invention is a four-layer structure including diffusion regions, gate lines across the diffusion regions, an interlayer dielectric (ILD) layer over the gate lines and the diffusion regions, and first and second comb structures. By designing the first test fingers or first metal teeth of the first comb structure to overlap with the diffusion regions while designing the second test fingers or second metal teeth of the second comb structure not to overlap with the diffusion regions, the test key of the invention can be used to sensitively detect the leakage current induced by the ILD void. Besides, the test key of the invention can be disposed on scribe lines between dies or in periphery regions within dies upon the process requirements.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A test key, comprising:
   a plurality of diffusion regions, disposed in a substrate and parallel to each other;
   a plurality of gate lines, disposed on the substrate and across the diffusion regions;
   a dielectric layer, covering the gate lines and the diffusion regions;
   a first comb structure comprising a plurality of first metal teeth, disposed on the dielectric layer and overlapping with the diffusion regions; and
   a second comb structure comprising a plurality of second metal teeth, disposed on the dielectric layer and not overlapping with the diffusion regions.

2. The test key of claim 1, wherein a distance between two adjacent gate lines is constant.

3. The test key of claim 1, wherein a distance between two adjacent gate lines is not constant.

4. The test key of claim 1, wherein a distance between two adjacent first and second metal teeth is constant.

5. The test key of claim 1, wherein a distance between two adjacent first and second metal teeth is not constant.

6. The test key of claim 1, wherein one of the second metal teeth is between two adjacent first metal teeth.

7. The test key of claim 1, wherein two adjacent second metal teeth are between two adjacent first metal teeth.

8. The test key of claim 1, wherein the first metal teeth are electrically connected to the diffusion regions through a plurality of conductive plugs.

9. The test key of claim 8, wherein one of the conductive plugs is between two adjacent gate lines.

10. The test key of claim 1, wherein first ends of the gate lines are connected to each other, and second ends of the gate lines are connected to each other.

11. The test key of claim 1, wherein first ends of the gate lines are separated from each other, and second ends of the gate lines are separated from each other.

12. The test key of claim 1, wherein at least one of the second metal teeth is electrically connected to an adjacent diffusion region when a void is generated in the dielectric layer.

13. The test key of claim 1, wherein the second metal teeth are electrically insulated from the diffusion regions when no void is generated in the dielectric layer.

14. The test key of claim 1, wherein the first comb structure and the second comb structure are electrically connected to a test circuit that is used to measure a leakage current created by voids in the dielectric layer.

15. The test key of claim 1, wherein the gate lines comprise polysilicon, silicide, metal or a combination thereof.

16. The test key of claim 1, wherein the diffusion regions are isolated by isolation regions.

17. The test key of claim 16, wherein a first surface of one isolation region between two adjacent gate lines is lower than a second surface of the isolation region below the gate lines.

* * * * *